US007685505B2

(12) United States Patent
Showmake

(10) Patent No.: US 7,685,505 B2
(45) Date of Patent: Mar. 23, 2010

(54) CODING APPARATUS, AND ASSOCIATED METHOD, FOR FORMING A PUNCTURED BINARY CONVOLUTIONAL CODE FOR USE IN A RADIO COMMUNICATION SYSTEM

(75) Inventor: Matthew Brenden Showmake, Allen, TX (US)

(73) Assignee: QUALCOMM Incorporated, San Diego, CA (US)

( * ) Notice: Subject to any disclaimer, the term of this patent is extended or adjusted under 35 U.S.C. 154(b) by 856 days.

(21) Appl. No.: 11/038,470

(22) Filed: Jan. 19, 2005

(65) Prior Publication Data

US 2005/0204269 A1 Sep. 15, 2005

Related U.S. Application Data

(60) Provisional application No. 60/537,588, filed on Jan. 20, 2004.

(51) Int. Cl.
*H03M 13/00* (2006.01)

(52) U.S. Cl. .................. 714/790; 714/755; 714/792; 714/796

(58) Field of Classification Search ................ 714/790, 714/755, 792, 794, 786, 788, 796, 803, 798; 370/334
See application file for complete search history.

(56) References Cited

U.S. PATENT DOCUMENTS

| | | | | |
|---|---|---|---|---|
| 6,023,783 A * | 2/2000 | Divsalar et al. | ............. | 714/792 |
| 6,170,076 B1 * | 1/2001 | Kim | ............. | 714/786 |
| 6,671,851 B1 * | 12/2003 | Moulsley | ............. | 714/790 |
| 7,054,292 B2 * | 5/2006 | Hall et al. | ............. | 370/334 |
| 7,146,552 B2 * | 12/2006 | Kim et al. | ............. | 714/755 |
| 7,293,224 B2 * | 11/2007 | Kim et al. | ............. | 714/790 |

OTHER PUBLICATIONS

IEEE 802.15.3, "Part 15.3: Wireless Medium Access Control (MAC) and Physical Layer (PHY) Specifications for High Rate Wireless Personal Area Networks (WPANs)," IEEE Computer Society, 2003.

* cited by examiner

*Primary Examiner*—Fritz Alphonse
(74) *Attorney, Agent, or Firm*—Dang M. Vo

(57) ABSTRACT

Coding apparatus, and an associated method, for forming punctured binary convolutional codes for use in a multi-band OFDM ultra wide band radio communication system. Input data to be communicated is provided to a convolutional coder that forms a ⅓ rate code forming first-stage codes. The ⅓ rate code is punctured by a puncture matrix to form resultant code words. The puncture matrix is of values that optimize code performance at various code rates.

19 Claims, 4 Drawing Sheets

128

| A0 | A1 | A2 | A3 |
| B0 | B1 | B2 | B3 |
| C0 | C1 | C2 | C3 |

| A0 | A1 | A2 | A3 | A4 |
| B0 | B1 | B2 | B3 | B4 |
| C0 | C1 | C2 | C3 | C4 |

| A0 | A1 | A2 | A3 | A4 | A5 |
| B0 | B1 | B2 | B3 | B4 | B5 |
| C0 | C1 | C2 | C3 | C4 | C5 |

CODING APPARATUS, AND ASSOCIATED METHOD, FOR FORMING A PUNCTURED BINARY CONVOLUTIONAL CODE FOR USE IN A RADIO COMMUNICATION SYSTEM

CROSS-REFERENCE TO RELATED APPLICATIONS

The present invention claims the priority of provisional patent application 60/537,588 filed on 20 Jan. 2004, the contents of which are incorporated herein by reference.

The present invention relates generally to a manner by which to code digital data to facilitate its successful communication upon a channel susceptible to distortion. More particularly, the present invention relates to apparatus, and an associated method, by which to form a punctured, binary convolutional code during communication operations of a multi-band OFDM (Orthogonal Frequency Division Multiplexed) ultra wide band (UWB), or other, radio communication system.

Puncture patterns are provided that optimize performance of the code at various code rates. A convolutional code is first formed that exhibits a 1/3 code rate given by generator polynomials $g_0=133_8$, $g_1=145_8$, and $g_2=175_8$. And, a puncture pattern is applied to the convolutional code to form resultant code words. Puncture patterns are provided that optimize performance of the code at 5/8, 3/4, 4/5, 5/6, 6/7, and 7/8 code rates. By optimizing the performance of the code, improved recovery of the informational content of the communicated data is possible, thereby correspondingly to improve communication performance of the communication system in which the code is utilized.

BACKGROUND OF THE INVENTION

Radio communication systems define radio channels upon data is communicated between a set of communication devices. Because data is communicated upon radio channels, rather than channels defined upon wirelines, communication of data is possible without the need to interconnect the communication devices of the set by way of fixed connections.

Communication of the data upon the radio channels is, however, sometimes challenging as the radio channels, defined upon a portion of the electromagnetic spectrum, are non-ideal, i.e., are susceptible to noise, fading, and other distortion. If severe, the data, when received at a receiving communication device might be distorted to an extent that the informational content of the received data can not be recovered.

Significant attention and effort is directed towards providing manners by which to overcome, and compensate for, the non-ideal nature of the radio channel upon which the data is communicated.

Transmit diversity is, for instance, sometimes used to introduce time redundancy upon the data prior to its communication upon the radio channel. Time redundancy introduced upon the data makes more likely its recovery even if portions of the communication data are significantly distorted. That is to say, by increasing the time redundancy of the data, the likelihood of its loss is reduced, particularly when the distortion introduced upon the data during its communication is time-varying.

Data coding techniques are amongst the techniques by which to introduce transmit diversity upon the data prior to its communication. Various types of coding schemes have been developed and are regularly utilized during communication operations to introduce the time redundancy upon the data.

Block coding techniques and convolutional coding techniques are too general categories of coding techniques that are commonly utilized. As the codes are typically used to facilitate the correction of errors introduced upon the data during its communication, the codes are sometimes referred to as being error control codes.

Convolutional codes, in general, operate upon an input data stream and encode the input data into code words, formed of encoded bits. The encoded bits of the code word include both convolved bits and nonconvolved bits. That is to say, the encoded bits of the code words depend not only on current input bits but also on past input bits.

The performance of a code, or technique by which to form the code, is characterized, at least in part, by its so-called distance property. An error control code that exhibits good performance tends, generally, to have large spacings, or distances, between code words that are formable by the code. The distance property permits a decoder, oftentimes a Viterbi decoder, to be constructed at a receiving communication device that attempts to identify the most likely transmitted code word by finding the code word that is nearest to a received sequence of data. Generally, the larger the distance between the code words, the greater the number of errors that can be tolerated in the transmission of the data while still permitting the data successfully to be decoded, thereby to recover the informational content of the data.

Standardization of communication protocols related to ultra wide band (UWB) orthogonal frequency division multiplex (OFDM) communications systems is ongoing. Data communications over wide bandwidths in such type of system, over short ranges, is, e.g., contemplated. A variant of the IEEE 802 family of communication standards, such as the IEEE 802.15.3a operating specification is undergoing standardization.

Ultra wide band transmission procedures, protocols and parameters are set forth in the operating specification. Included amongst the proposals for inclusion in the standardized operating specification are error control codes that achieve various data communication rates.

While the existing error control codes that are presently proposed provide coding gain to help compensate for, or overcome, communication of data upon a non-ideal channel, not all of the codes provide for optimal performance.

In a manner could be provided that would perform better at various code rates, improved communication performance would be possible in a communication system operable in conformity with the operating specification.

It is light of this background information related to communications in a radio communication system that the significant improvements of the present invention have evolved.

SUMMARY

The present invention, accordingly, advantageously provides apparatus, and an associated method, by which to code digital data to facilitate its communication upon a channel susceptible to distortion.

Through operation of an embodiment of the present invention, a manner is provided by which to form a punctured, binary convolutional code during communication operations of a multi-band OFDM, ultra band, or other, radio communication system.

In one aspect of the present invention, puncture patterns are provided that optimize performance of the code at various code rates. The puncture patterns are applied to first-stage, convolutionally coded data exhibiting a mother code rate of 1/3. The first-stage, convolutionally-coded data is formed by a convolutional code given by generator polynomials of $g_0=133_8$, $g_1=145_8$, and $g_2=175_8$. The first-stage, convolutional code, so-formed, is a code generated in conformity with a code generator set forth in the IEEE 802.15 Document No. 15-03-02628.

The puncture pattern applied to the first-stage, convolutionally coded data is determinative of the resultant code rate of the code. By using a puncture pattern that steals greater numbers of bits of the first-stage, convolutional code, the resultant code rate of the resultant code word so-formed is a larger value. The puncture patterns that are selected to be applied to the first-stage, convolutional code, and determinative of the resultant rate of the resultant code are optimal for the rate of the resultant code word. The optimization of the performance is defined in terms of quantitative indicia, such as, for instance, free distances between code words formable by the code or the number of nearest neighbors to a code word, both well-known quantities by which code performance is defined.

The puncture pattern applied to the first-stage, convolutional code, in one implementation, defines a rate 5/8 code in which the puncture pattern is defined by a puncture matrix, P, with values of P=[11100; 10011; 01100]. When the puncture pattern is applied to the first-stage, convolutional code, the resultant code word is coded at a rate 5/8 code and exhibits a minimum free distance of six and has a single nearest neighbor.

The puncture pattern applied to the first stage, convolutional code, in another implementation, defines a rate 3/4 code in which the puncture pattern is defined by a puncture matrix, P, with values of P=[100; 000; 111]. When the puncture pattern is applied to the first stage convolutional code, the resultant code word is coded at a rate 3/4 code and exhibits a minimum free distance of five and has seven nearest neighbors.

The puncture pattern applied to the first-stage, convolutional code, in another implementation, defines a rate 4/5 code in which the puncture pattern is defined by a puncture matrix P with values of P=[1000; 0111; 1000]. When the puncture pattern is applied to the first-stage, convolutional code, the resultant code word is coded at a rate 4/5 code and exhibits a minimum free distance of four and has two nearest neighbors.

The puncture pattern allied to the first-stage convolutional code, in another implementation, defines a rate 5/6 code in which the puncture pattern is defined by a puncture matrix P with values of P=[10001; 01010; 10100]. When the puncture pattern is applied to the first-stage convolutional code, the resultant code word is coded at a rate of 5/6 and exhibits a minimum free distance of four and has seven nearest neighbors.

The puncture pattern applied to the first-stage, convolutional code, in another implementation defines a rate 6/7 code in which the puncture pattern is defined by a puncture matrix, P with values of P=[100001; 010010; 101100]. When the puncture pattern is applied to the first-stage, convolutional code, the resultant code word is coded at a rate 6/7 code and exhibits a minimum free distance of four and has sixteen nearest neighbors.

The puncture pattern applied to the first-stage, convolutional code, in another implementation, defines a rate 7/8 code in which the puncture pattern is defined by a puncture matrix P with values of P=[0100001; 1010000; 0101110]. When the puncture pattern is applied to the first-stage, convolutional code, the resultant code word is coded at a rate 7/8 code and exhibits a minimum free distance of four and has forty-two nearest neighbors.

When communication data is coded in a manner to form the punctured binary convolutional code at one of the aforementioned code rates, coding is provided by which to compensate for, or overcome, the communication of the data upon a channel susceptible to distortion while optimizing performance of the code, at the selected code rate. Improved communication operations are provided as the ability best to decode the data when received at a receiving communication device is permitted through the coding in manners, for the selected code rate, maximized performance criteria.

In these and other aspects, therefore, apparatus, and an associated method, is provided for coding input data into channel coded form for communication upon a communication channel. A first coder element is adapted to receive the input data. The first coder element codes the input data at a 1/3 code rate to form first coded data. A code puncturer is adapted to receive the first coded data formed by the first coder element. The code puncturer punctures the first coded data to form resultant code words that exhibit a resultant code rate, relative to the input data, greater than 1/2. The resultant code words are formed by puncturing the first coded data with a selected puncture code. The selected puncture code is selected to maximize, for the resultant code rate, minimum distances between individual ones of the resultant code words.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

FIG. 5 illustrates a puncture sequence matrix representative of a puncture pattern used pursuant to operation of another embodiment of the present invention.

FIG. 6 illustrates another puncture sequence matrix representative of a puncture pattern used pursuant to exemplary operation of another embodiment of the present invention.

FIG. 7 illustrates another puncture sequence matrix also representative of a puncture pattern used pursuant to exemplary operation of an embodiment of the present invention.

DETAILED DESCRIPTION

Figure 1:
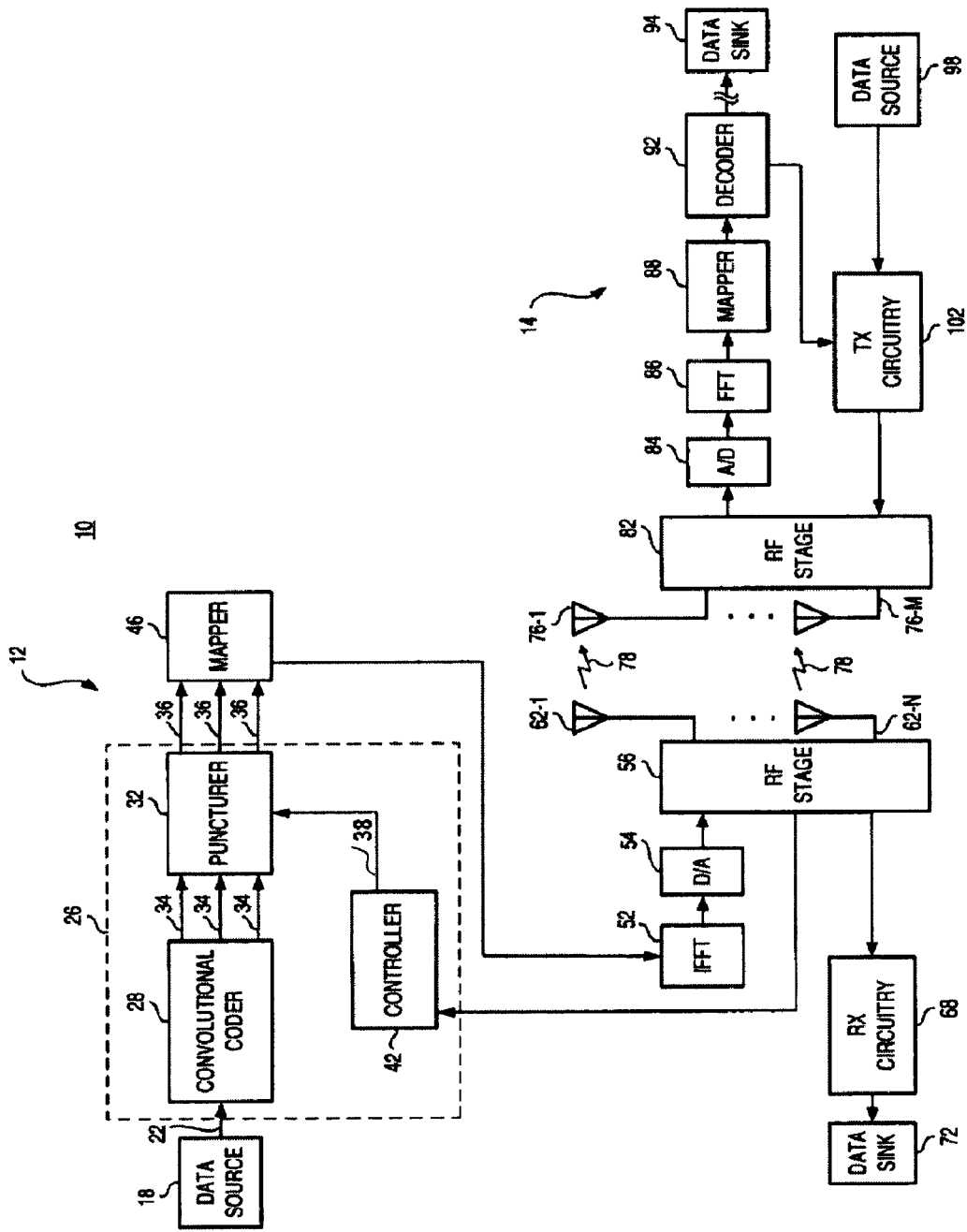
FIG. 1 illustrates a radio communication system in which an embodiment of the present invention is operable.

Referring first to FIG. 1, a communication system, shown generally at 10, provides for radio communications between a sending communication device 12 and a receiving communication device 14. In the exemplary implementation shown in the figure, the sending and receiving communication devices each are capable of two-way communications. That is to say, each of the devices 12 and 14 include transmit and receive parts capable both of sending and of receiving communication data. In the following description of exemplary operation, operation shall be described with respect to communication data sent by the communication device 12 to the communication device 14. Analogous operation in which the communication device 14 originates data for communication to the communication device 12 can similarly be described.

The communication system 10, in the exemplary embodiment, forms an ultra wide band (UWB) OFDM (orthogonal Frequency Division Multiplexing) ultra wide band (UWB) system that provides for high data rate communications over short distances. The communication system is operable in general conformity with a variant of an IEEE 802 operating specification that pertains to UWB OFDM communications, such as the IEEE 802.15a operating specification.

While operation of an embodiment of the present invention has particular applicability to communications in a UWB OFDM communication system operable in conformity with the variant of the IEEE 802 operating specification, operation of the present invention analogously also has applicability in other types of communication systems in which data is to be communicated upon a channel susceptible to distortion. Accordingly, the following description is exemplary only, and the teachings of the present invention can analogously be described with respect to communications in another type of communication system.

The data to be sent by the sending communication device 12 is originated at a data source 18 that generates binary data forming input bits, or an input message on the line 22. The input bits are provided to the apparatus, shown generally at 26, of an embodiment of the present invention. The apparatus 26 operates to form code words that introduce time redundancy upon the input bits generated on the line 22. The apparatus 26 is functionally represented, implementable in any desired manner, such as by a processor that executes algorithms or by an ASIC.

The apparatus 26 is here shown to include a convolutional coder 28 and a code puncturer 32. The coder 28 is connected to receive the input bits generated on the line 22 and operates to convolutionally code the input bits to form a first-stage code on the lines 34. The coded data generated on the lines 34 includes both convolved bits and nonconvolved bits. The coder 28 forms a rate ⅓ code that is given by generator polynomials $g_0 = 133_8$, $g_1 = 145_8$ and $g_2 = 175_8$. The first-stage code formed of the rate ⅓ code on the lines 34 forms a code mother rate that is alterable by the puncturer 32.

The puncturer punctures the first-stage codes applied thereto on the lines 34 by a selected puncture pattern to form resultant code words on the lines 36. The selection of the puncture pattern, or the selected puncture pattern, is provided to the puncturer by way of the line 38 that extends to the puncturer from a controller 42. The puncture matrix that is selected to be applied to the first-stage coded data is determinative of the resultant code rate of the code words generated on the lines 36. Pursuant to operation of an embodiment of the present invention, the selected puncture patterns, formed of the puncture matrices, are optimal for the resultant code rate of the code words formed by the apparatus 26.

The sending communication station further includes a mapper 46 that is coupled to the lines 36 to receive the resultant code words formed by puncturing the first-stage codes. The mapper operates, in conventional manner, to map the values of the input code words to data symbols, e.g., QPSK (Quartinary Phase Shift Keying) symbols, 16-QAM symbols, etc. Once mapped, the symbols are provided to an inverse fast Fourier transformer (IFFT) 52 convert the domain of the symbols into the time domain. Once transformed, the transformed symbol values are provided to a digital-to-analog (D/A) converter 54 to convert the values of the symbols into analog form. And, the symbol values are thereafter provided to an RF (Radio Frequency) element 56 at which normal radio transmit operations are performed and the symbol values are modulated to be in form for their subsequent transmission by N transmit antennas 62. A multiple antenna configuration is shown in the figure. In other implementations, a single transmit antenna is utilized, i.e., N=1.

The RF element also includes an RF receive part that operates pursuant to regular FR receive operations to operate upon data received at the communication device. And, once down-converted, the down-converter receive data is provided to additional receive circuitry 66 that performs, for instance, base band A/D, FFT, mapping, and decoding operations. The receive circuitry is coupled to a data sink 72 to which receive data, once operated upon by the receive circuitry is provided.

The receiving communication device 14 includes M receive antennas 76 that detect data communicated by way of the radio channels upon which the data is communicated. Arrows 78 are representative of the radio channels upon which the data is communicated. The receive data, once converted into electrical form from electromagnetic form is provided to an RF element 82 that operates to perform normal receive operations upon the receive data, including down-conversion operations. Once down-converted, the receive data is converted into digital form by an analog-to-digital converter 84, converted into the frequency domain by the fast Fourier transformer 86, mapped into binary form by the mapper 88, decoded by the decoder 92, and provided to a data sync 94.

The communication device 14 also operates to transmit communication data, here, for instance, data sourced at a data source 98, operated upon by a transmitter circuitry 102, and then by a transmit part of the RF element 82. In one implementation, the communication device sends back indications of communication quality levels of the communicated data are indicated by the communication device 14 to the communication device 12 in a closed-loop control scheme, such as an ACK or NAK acknowledgement scheme. And, selection of the puncture pattern that is to be used is dependent upon the communication quality levels. When communication quality levels are poor, the coding rate is appropriately altered in order to increase the time redundancy of the communicated data. And, when communication qualities are good, the coding rate is also appropriately adjusted to reduce the time redundancy of the communicated data, thereby to increase the data throughput rate.

Figures 2, 3, 4:
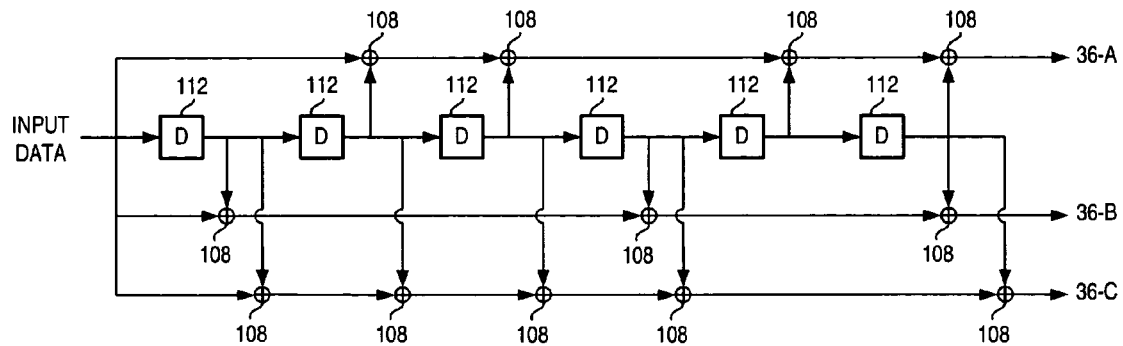
FIG. 2 illustrates a functional block diagram of a portion of a sending communication device that forms part of the communication system shown in FIG. 1.
FIG. 3 illustrates a puncture sequence matrix representative of a puncture pattern used pursuant to exemplary operation of an embodiment of the present invention.
FIG. 4 illustrates another puncture sequence matrix, representative of another puncture pattern used pursuant to exemplary operation of an embodiment of the present invention.

FIG. 2 illustrates a representation of the coder 28 that forms part of the communication system shown in FIG. 1. Again, the input data bits are applied on line 22 to the coder, and first-stage codes are again shown generated on the lines 36. Non-convolved bits are formed on the lines 36-A and 36-B, and convolved bits are generated on the line 36-C. As shown, the coder includes a plurality of combiners 108 and a plurality of delay elements 112. The coder corresponds to a coder described in IEEE 802.15 Document Number 15-03-0268. And, the generator polynomials, as noted previously, are octal 133, 145, and 175. And, also as noted previously, a rate ⅓ code is formed of the input data bits.

As additionally set forth in the IEEE 802.15 Document Number 15-03-0268 puncture patterns applied to the first-stage codes caused resultant code words to be of 11/32 code rates, ⅓ code rates, 11/32 code rates, ½ code rates, ⅝ code rates, and ¾ code rates. While the puncture matrices that form the ⅓, ¹¹/₃₂, and ½ code rates are optimal, puncture patterns provided pursuant to embodiments of the present invention comprise puncture patterns that optimize performance at their associated code rates.

FIG. 3 illustrates a puncture pattern 118 performing a rate ⅝ code that exhibits optimal free distance properties. Bits indicated by the shading in the pattern 118 define stolen bits that are punctured from the coded data to form the resultant code words. The puncture matrix P corresponding to the puncture pattern 118, which "one" means to not puncture out a bit and a "zero" means to puncture a bit. The rate ⅝ code puncture pattern is: P=[11100; 10011; 01100].

FIG. 4 illustrates a puncture pattern 124 that forms a rate ¾ code that exhibits optimal minimum free distance properties. Here also, bits indicated by the shading in the pattern 124 define stolen bits that are punctured from the coded data to form the resultant code words. The puncture matrix P corresponding to the puncture pattern 124 again is defined in terms in which "one" means do not puncture out a bit and a "zero" means to puncture a bit. The rate ¾ code puncture pattern is: P=[100; 000; 111].

FIG. 5 illustrates a puncture pattern 128 for forming a rate ⅘ code of the underlying rate ⅓ code that exhibits optimal minimum free distance properties. The minimum free distance property is of a value of 4 and the resultant code exhibits 2 nearest neighbors. Again, bits indicated by the shading in the pattern 128 defines stolen bits that are punctured from the coded data to form the resultant code words. And, again, "one" means do not puncture out a bit and "zero" means to puncture a bit. The rate ⅘ code puncture pattern is: P=[1000; 0111; 1000].

FIG. 6 illustrates a puncture pattern ¹/₃₂ for rate ⅚ code that exhibits optimal minimum free distance properties. The minimum free distance property of the resultant code words exhibits a minimum free distance of 4 and the resultant code word has 7 nearest neighbors. Bits indicated by the shading in the pattern 132 define stolen bits that are punctured from the coded data to form the resultant code words. The rate ⅚ code puncture pattern is: P=[10001; 01010; 10100].

FIG. 7 illustrates a puncture pattern 136 that is used to form a rate 6/7 code that exhibits optimal minimum free distance properties. The minimum free distance property is of a value of 4 and the resultant code has 16 nearest neighbors. Bits indicated by the shading in the patter 136 define stolen bits that are punctured from the coded data to form the resultant code words. The rate 6/7 code puncture pattern is: P=[100001; 010010; 101100].

Figures 8, 9:
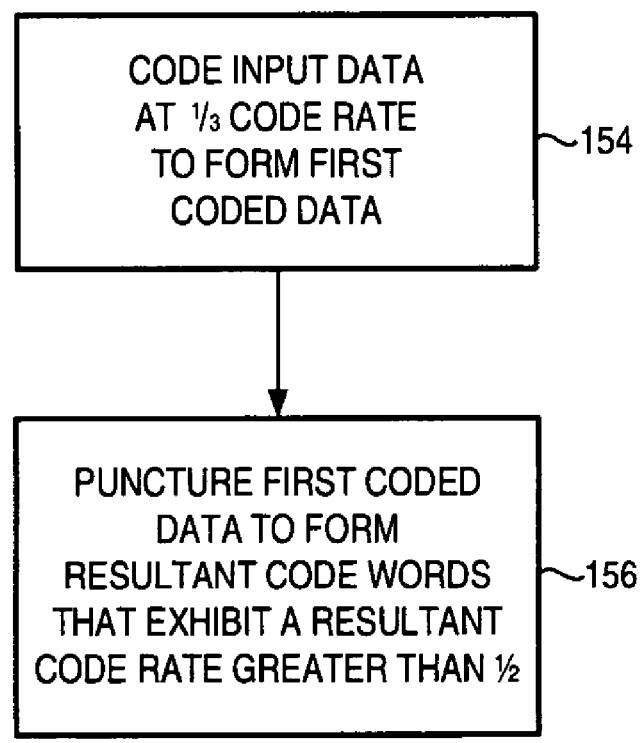
FIG. 8 illustrates another puncture sequence matrix also representative of a puncture pattern used pursuant to exemplary operation of another embodiment of the present invention.
FIG. 9 illustrates a method flow diagram representative of the method of operation of an embodiment of the present invention.

FIG. 8 illustrates a puncture pattern 140 for forming a rate ⅞ code that exhibits optimal minimum free distance properties. The minimum free distance properties of a value of 4, and the resultant code word has 42 nearest neighbors. Bits indicated by the shading in the pattern 140 defines stolen bits that are punctured from the coded data to form the resultant code words. The rate ⅞ code puncture pattern is: P=[0100001; 1010000; 0101110].

Additional rate codes are also formable during operation of the apparatus 26. For instance, a rate ¹¹/₃₂ code is formable using a puncture matrix P defined by a letter P defined by a puncture pattern of: P=[11111111111; 11111111111; 11111111110]. And, a rate ½ code is formable by applying, to the mother rate ⅓ code a puncture pattern P of: P=[11111111111; 00000000000; 11111111111].

FIG. 9 illustrates a method, shown generally at 152, of an embodiment of the present invention by which to code input data into channel-coded form for communication upon a communication channel.

First, and as indicated by the block 154, the input data is coded at a ⅓ code rate to form first coded data therefrom.

Then, and as indicated by the block 156, the first coded data is punctured to form resultant code words that exhibit a resultant code rate, relative to the input data, greater than ½. The resultant code words are formed by puncturing the first coded data with a selected puncture code. The selected puncture code is selected to maximize, for the resultant code rate, minimum distances between individual ones of the code words.

By optimizing the minimum distances between the individual ones of the code words, the receiving communication device that receives the data, subsequent to communication upon the channel, is best able to recreate the informational content of the transmitted data.

The previous descriptions are of preferred examples for implementing the invention, and the scope of the invention should not necessarily be limited by this description. The scope of the present invention is defined by the following claims.

I claim:

1. An apparatus for coding input data into channel-coded form for communication upon a communication channel, said apparatus comprising:
    a coder element adapted to receive the input data and to code the input data at a ⅓ code rate to form first coded data;
    a code puncturer adapted to receive the coded data and to puncture the coded data with a puncture code,
    wherein the puncture code comprises:

$$P = \begin{bmatrix} 1 & 0 & 0 \\ 0 & 0 & 0 \\ 1 & 1 & 1 \end{bmatrix}, \text{ or } P = \begin{bmatrix} 1 & 0 & 0 & 0 \\ 0 & 1 & 1 & 1 \\ 1 & 0 & 0 & 0 \end{bmatrix},$$

$$\text{or } P = \begin{bmatrix} 1 & 1 & 1 & 0 & 0 \\ 1 & 0 & 0 & 1 & 1 \\ 0 & 1 & 1 & 0 & 0 \end{bmatrix}, \text{ or } P = \begin{bmatrix} 1 & 0 & 0 & 0 & 1 \\ 0 & 1 & 0 & 1 & 0 \\ 1 & 0 & 1 & 0 & 0 \end{bmatrix},$$

$$\text{or } P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}, \text{ or } P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

2. The apparatus of claim 1 wherein the first coded data formed by said first coder element comprises a combination of present and prior bits of the input data.

3. The apparatus of claim 1 wherein the coder element comprises a convolutional coder.

4. The apparatus of claim 1, wherein the puncture code is:

$$P = \begin{bmatrix} 1 & 1 & 1 & 0 & 0 \\ 1 & 0 & 0 & 1 & 1 \\ 0 & 1 & 1 & 0 & 0 \end{bmatrix}.$$

5. The apparatus of claim 1, wherein the puncture code is:

$$P = \begin{bmatrix} 1 & 0 & 0 \\ 0 & 0 & 0 \\ 1 & 1 & 1 \end{bmatrix}.$$

6. The apparatus of claim 1, wherein the puncture code is:

$$P = \begin{bmatrix} 1 & 0 & 0 & 0 \\ 0 & 1 & 1 & 1 \\ 1 & 0 & 0 & 0 \end{bmatrix}.$$

7. The apparatus of claim 1, wherein the puncture code is:

$$P = \begin{bmatrix} 1 & 0 & 0 & 0 & 1 \\ 0 & 1 & 0 & 1 & 0 \\ 1 & 0 & 1 & 0 & 0 \end{bmatrix}.$$

8. The apparatus of claim 1 wherein the puncture code is:

$$P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}.$$

9. The apparatus of claim 1 wherein the puncture code is:

$$P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

10. An apparatus for coding input data into channel-coded form for communication upon a communication channel, said apparatus comprising:
    a first coder element adapted to receive the input data, said first coder element for coding the input data at a ⅓ code rate to form first coded data; and
    a code puncturer adapted to receive the first coded data formed by said first coder element, said code puncturer for puncturing the first coded data to form resultant codewords that exhibit a resultant code rate, relative to the input data, greater than ½, the resultant codewords formed by puncturing the first coded data with a selected puncture code, the selected puncture code selected to maximize, for the resultant code rate, minimum distances between individual ones of the resultant codewords and minimize a number of nearest neighbors to individual ones of the resultant codewords,
    wherein the first coder element comprises a convolutional coder; and
    wherein the convolutional coder forming said first coder element is defined in terms of a set of generator polynomials including a first octal-valued polynomial of 133, a second octal-valued polynomial of 145 and a third octal-valued polynomial of 175.

11. A method for coding input data into channel-coded form for communication upon a communication channel, said method comprising the operations of:
    coding the input data at a ⅓ code rate to form coded data therefrom; and
    puncturing the coded data with a puncture code,
    wherein the puncture code comprises:

$$P = \begin{bmatrix} 1 & 0 & 0 \\ 0 & 0 & 0 \\ 1 & 1 & 1 \end{bmatrix}, \text{ or } P = \begin{bmatrix} 1 & 0 & 0 & 0 \\ 0 & 1 & 1 & 1 \\ 1 & 0 & 0 & 0 \end{bmatrix},$$

$$\text{or } P = \begin{bmatrix} 1 & 1 & 1 & 0 & 0 \\ 1 & 0 & 0 & 1 & 1 \\ 0 & 1 & 1 & 0 & 0 \end{bmatrix}, \text{ or } P = \begin{bmatrix} 1 & 0 & 0 & 0 & 1 \\ 0 & 1 & 0 & 1 & 0 \\ 1 & 0 & 1 & 0 & 0 \end{bmatrix},$$

-continued $$\text{or } P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}, \text{ or } P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

12. The method of claim 11 wherein the puncture code is:

$$P = \begin{bmatrix} 1 & 1 & 1 & 0 & 0 \\ 1 & 0 & 0 & 1 & 1 \\ 0 & 1 & 1 & 0 & 0 \end{bmatrix}.$$

13. The method of claim 11 wherein the puncture code is:

$$P = \begin{bmatrix} 1 & 0 & 0 \\ 0 & 0 & 0 \\ 1 & 1 & 1 \end{bmatrix}.$$

14. The method of claim 11 wherein the puncture code is:

$$P = \begin{bmatrix} 1 & 0 & 0 & 0 \\ 0 & 1 & 1 & 1 \\ 1 & 0 & 0 & 0 \end{bmatrix}.$$

15. The method of claim 11 wherein the puncture code is:

$$P = \begin{bmatrix} 1 & 0 & 0 & 0 & 1 \\ 0 & 1 & 0 & 1 & 0 \\ 1 & 0 & 1 & 0 & 0 \end{bmatrix}.$$

16. The method of claim 11 wherein the puncture code is:

$$P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}.$$

17. The method of claim 11 wherein the puncture code is:

$$P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

18. An apparatus for coding input data into channel-coded form for communication upon a communication channel, said apparatus comprising:
    means for coding input data at a ⅓ code rate to form coded data therefrom; and
    means for puncturing the coded data with a puncture code,
    wherein the puncture code comprises a matrix P selected from the group of:

$$P = \begin{bmatrix} 1 & 0 & 0 \\ 0 & 0 & 0 \\ 1 & 1 & 1 \end{bmatrix}, P = \begin{bmatrix} 1 & 0 & 0 & 0 \\ 0 & 1 & 1 & 1 \\ 1 & 0 & 0 & 0 \end{bmatrix},$$

$$P = \begin{bmatrix} 1 & 1 & 1 & 0 & 0 \\ 1 & 0 & 0 & 1 & 1 \\ 0 & 1 & 1 & 0 & 0 \end{bmatrix}, P = \begin{bmatrix} 1 & 0 & 0 & 0 & 1 \\ 0 & 1 & 0 & 1 & 0 \\ 1 & 0 & 1 & 0 & 0 \end{bmatrix},$$

$$P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}, \text{ and } P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

19. A communication device comprising:

a coder element adapted to receive input data and to code the input data at a ⅓ code rate to form first coded data;

a code puncturer adapted to receive the coded data and to puncture the coded data with a puncture code; and one or more transmit antennas adapted to transmit the coded data, wherein the puncture code comprises a matrix P selected from the group of:

$$P = \begin{bmatrix} 1 & 0 & 0 \\ 0 & 0 & 0 \\ 1 & 1 & 1 \end{bmatrix}, P = \begin{bmatrix} 1 & 0 & 0 & 0 \\ 0 & 1 & 1 & 1 \\ 1 & 0 & 0 & 0 \end{bmatrix},$$

$$P = \begin{bmatrix} 1 & 1 & 1 & 0 & 0 \\ 1 & 0 & 0 & 1 & 1 \\ 0 & 1 & 1 & 0 & 0 \end{bmatrix}, P = \begin{bmatrix} 1 & 0 & 0 & 0 & 1 \\ 0 & 1 & 0 & 1 & 0 \\ 1 & 0 & 1 & 0 & 0 \end{bmatrix},$$

$$P = \begin{bmatrix} 1 & 0 & 0 & 0 & 0 & 1 \\ 0 & 1 & 0 & 0 & 1 & 0 \\ 1 & 0 & 1 & 1 & 0 & 0 \end{bmatrix}, \text{ and } P = \begin{bmatrix} 0 & 1 & 0 & 0 & 0 & 0 & 1 \\ 1 & 0 & 1 & 0 & 0 & 0 & 0 \\ 0 & 1 & 0 & 1 & 1 & 1 & 0 \end{bmatrix}.$$

\* \* \* \* \*

UNITED STATES PATENT AND TRADEMARK OFFICE
CERTIFICATE OF CORRECTION

| | | |
|---|---|---|
| PATENT NO. | : 7,685,505 B2 | |
| APPLICATION NO. | : 11/038470 | |
| DATED | : March 23, 2010 | |
| INVENTOR(S) | : Showmake | |

It is certified that error appears in the above-identified patent and that said Letters Patent is hereby corrected as shown below:

Title Page; item (75);
Front page, line 6, inventor name: "Brenden" to read as --Brendan--

Column 8, line 41, claim 2: "said first coder element" to read as --a first coder element--

Signed and Sealed this
Twelfth Day of July, 2011

David J. Kappos
*Director of the United States Patent and Trademark Office*